United States Patent [19]

Lovell

[11] Patent Number: 4,823,106

[45] Date of Patent: Apr. 18, 1989

[54] TAPE ELEMENT AND METHODS, FOR HEATING, PRESSURE MEASUREMENT AND CIRCUIT FABRICATION

[75] Inventor: Walter C. Lovell, Wilbraham, Mass.

[73] Assignee: Tapeswitch Corporation of America, Farmingdale, N.Y.

[21] Appl. No.: 153,221

[22] Filed: Feb. 8, 1988

Related U.S. Application Data

[62] Division of Ser. No. 884,220, Jul. 10, 1986, Pat. No. 4,758,815.

[51] Int. Cl.[4] .............................................. H01L 3/06

[52] U.S. Cl. .................................... 338/212; 338/210; 219/546; 219/553; 29/610.1

[58] Field of Search ....................... 338/210, 212, 128; 219/528, 546, 549, 553; 29/610 R

[56] References Cited

U.S. PATENT DOCUMENTS

| | | | |
|---|---|---|---|
| 3,268,846 | 8/1966 | Morey | 338/212 |
| 3,627,981 | 12/1971 | Kuhn | 338/210 X |
| 3,683,361 | 8/1972 | Salzwedel | 338/212 |
| 3,757,087 | 9/1973 | Bernard | 338/210 X |
| 4,679,107 | 7/1987 | Imakoshi et al. | 338/32 R |

*Primary Examiner*—E. A. Goldberg
*Assistant Examiner*—M. M. Lateef
*Attorney, Agent, or Firm*—Hoffmann & Baron

[57] ABSTRACT

Ordinary inexpensive magnetic recording tape is used to create a novel resistance element which may be made pressure sensitive to perform a number of tasks involving robot finger control intrusion alarm systems, and portable weighing scales. A pressure insensitive resistance element is also used as an efficient, inexpensive heating tape element, or to make precision resistors having little bulk, and resistive networks which may be customized by a user.

37 Claims, 7 Drawing Sheets

Fig. 1
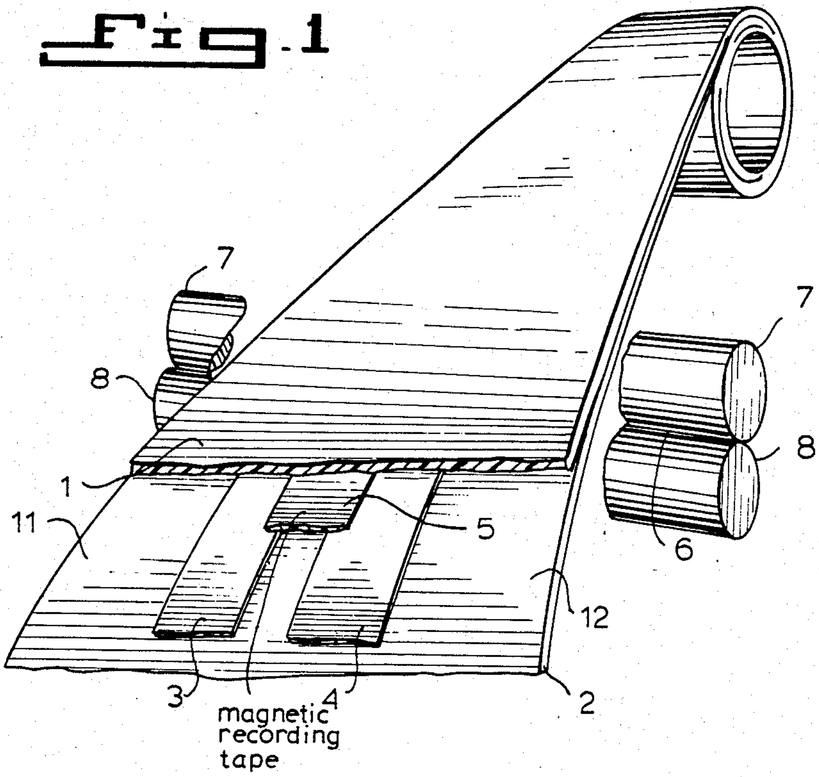
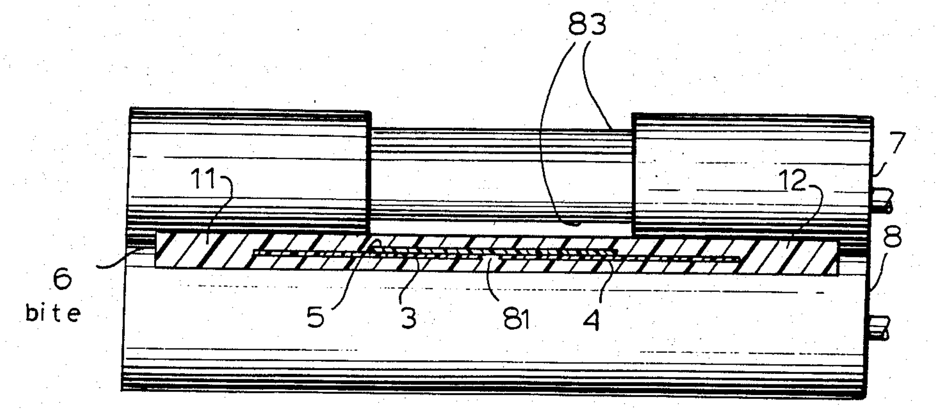
Fig. 9

Fig. 5
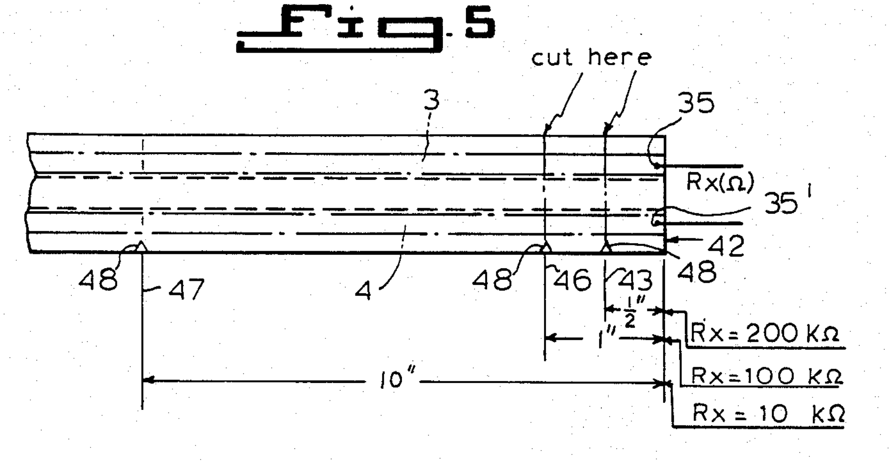
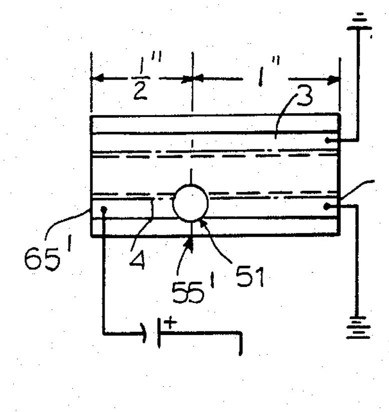
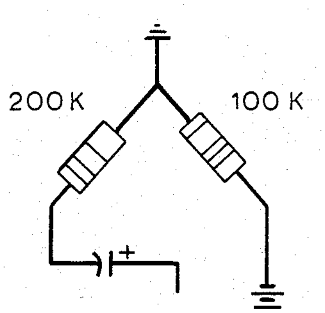
Fig. 6
Fig. 7
PRIOR ART

Fig.12
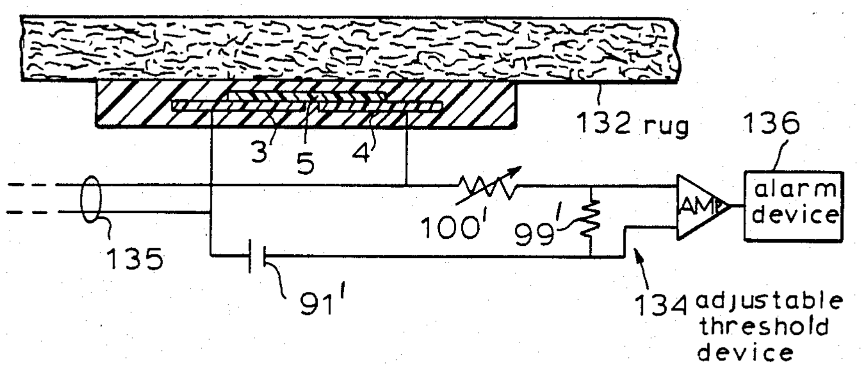
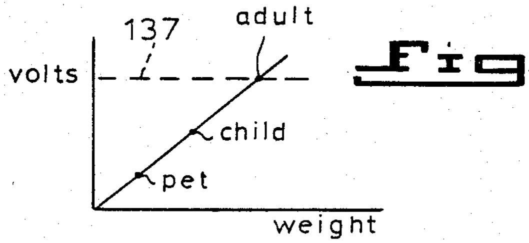
Fig.13
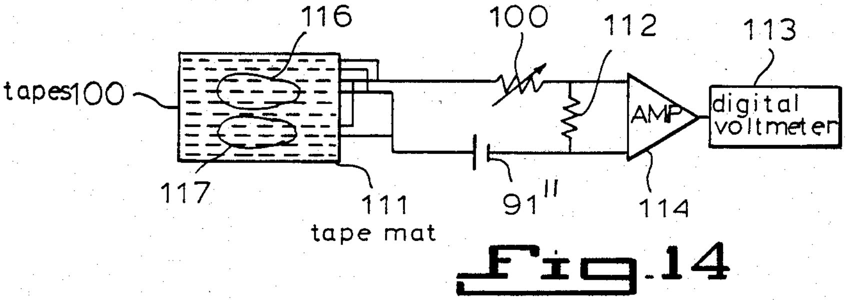
Fig.14

Fig.15
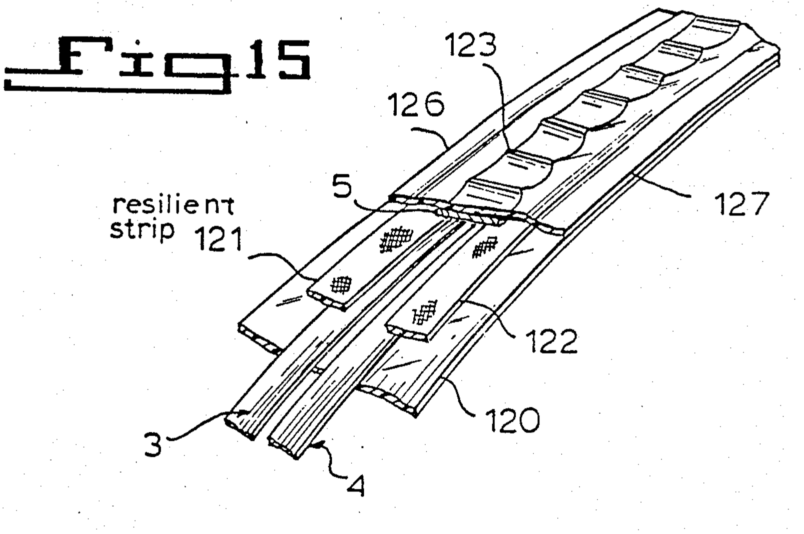
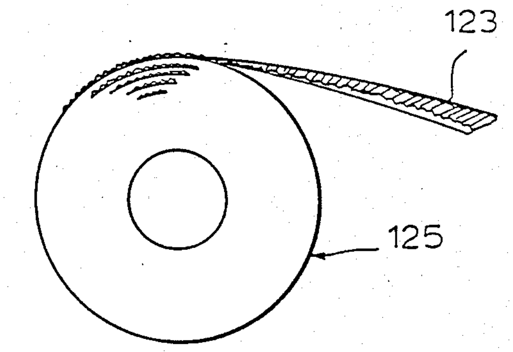
Fig.16

TAPE ELEMENT AND METHODS, FOR HEATING, PRESSURE MEASUREMENT AND CIRCUIT FABRICATION

This is a division of application Ser. No. 884,220 filed July 10, 1986, now U.S. Pat. No. 4,758,815 issued July, 19, 1988.

FIELD OF INVENTION

This invention relates to the field of electrical resistance elements.

BACKGROUND OF THE INVENTION

Numerous attempts have been made in the past to produce a safe, reliable and inexpensive electrically energized flat heating tape useful for heating floors, walls and the like. The process of generating heat by passing a current through carbon or semi-conductive material is very old, and many attempts have been made in the past to introduce a tape of a simple design which is inexpensive to manufacture, and furthermore is free of the danger of overheating which could produce a fire hazard.

Electrically energized heating tapes should also be rugged and capable of being tightly rolled up in a compact manner for shipment and storage. One prior art approach is to utilize high resistance metallic conductors such as nichrome wires embedded within a plastic substrate, whereby the conductors are coupled in series to generate heat. When a pair of these wires are employed in such a substrate, they must be connected in series to form a closed circuit, after the substrate is cut to a desired often indefinite, length. However, providing the necessary connections between the two wires at terminal portions of the tape after being cut, is an annoyance, and the connecting device could be dangerous when 115 volts are employed to energize the tape. Also, the length of the tape has to be related to the applied voltage, and hence the user of the tape is not free to cut a desired length of tape.

U.S. Pat. No. 3,387,248 to Rees, teaches overlaying a carbon conductive substrate with a pair of conductive strips so that the carbon substrate bridges the conductors, rendering electrical connection between end portions of the twin parallel conductors unnecessary, in contrast with the aforesaid arrangement utilizing twin nichrome wire leads connected in series. However, electrically conductive adhesives are utilized to bond the parallel conductors to the graphite substrate, and the use of an additional adhesive creates problems, since the tape is often curled when applied to a pipe for example, or during roll-up upon shipment, in turn causing a loosening of the otherwise firm connection necessary to maintain uniform current flow at the junction between the parallel conductors and the resistive substrate. This problem is evidenced by the statement in column 2 of the patent, that "in order to improve the fixation of the electrode it may also be anchored mechanically to the sheet or layer, for example, by interlacing it with the weave of the fibrous support, when one is employed, or alternatively crimping the electrode to the layer or sheet prior to embedding in the cold setting rubber."

Any loosening of the junction between the twin electrical conductors and the heating substrate is very detrimental since "hot spots" may be produced due to the resulting high voltage gradient across the air gap between the surface of the electrical conductor and the material making up the resistive element. Such "hot spots" are a fire hazard, due to the resulting sparking within the air gaps producing overheating, and even possible destruction of the electrical connector junction point.

The aforesaid mechanical anchoring approach is similar to the approach of stitching or stapling the twin electrical conductors to the conducting heat generating substrate as taught by U.S. Pat. No. 3,385,959 to Ames. This approach is by it's very nature crude and a nuisance to implement in the manufacturing process. Additionally, the desired flexibility in the tape, is generally not permitted through the use of these techniques; the manufacturer should be able to ship the heating tape in relatively compact rolls, while the tape should be capable of being bent about sharp corners during installation.

In U.K. Pat. No. 2,065,430, a pair of conductive strips are positioned over a carbon heating substrate. In this patent there is no suggestion of a bonding agent between the twin conductors and the substrate, and thus the tape will only function without "hot spots" if it is wrapped around a tube or pipe to maintain the conductors tightly against the heating substrate, and this application is emphasized in FIG. 1 of the patent.

I am quite familiar with the U.S. Pat. No. 4,485,297 to Grise et al. since I personally designed some of the manufactured components for the inventors. Heating tapes are presently manufactured in accordance with the teachings of this patent, employing a striped pattern of granular carbon which is silk screened upon the substrate. This method is costly, and requires a closely controlled thickness of the carbon paste mixture making up the stripes and the printed width of each heating strip to prevent the formation of air gaps and the resulting detrimental hot spots. The carbon strips have to be of high conductivity, to create a low enough resistance to generate sufficient heat. The hot spot problem is approached by increasing the thickness of the carbon stripes at the contacts, such contacts having a curved configuration as illustrated in FIG. 2 of the patent. This creates a kind of "sandpile" under the curved conductors so that when the tape is rolled or flexed, the particles tend to roll under the curved conductive strip in order to maintain contact, and hence minimize the formation of the air gaps leading to sparking and hot spots.

It is thus highly desirable to create a simple design of a heating tape which is inexpensive to manufacture and produces consistent quantities of heat upon the application of a given voltage to the tape without the danger of overheating due to hot spots created by non-uniformity in the electrical junctions themselves, or non-uniformity of the resistive material generating the heat. It is also highly desirable to provide an ultra thin tape which tends to minimize the above mentioned problems, which may be readily rolled up without stretching the electrical connectors between the resistive layer and the supply conductors, resulting in uneven current flow and possible hot spots, and which does not employ a failure-prone electrically conductive adhesive between the supply conductors and the resistive bridging element.

SUMMARY OF EMBODIMENTS OF THE INVENTION

In spite of all of the patents that I have studied relating to flexible heating tapes, it was many months before I discovered how to design a practical, inexpensive, laminated heating tape, surprisingly utilizing ordinary commercially available magnetic recording tape in a parallel bridged structure. I also discovered that the contact conductance between the voltage supply conductors and the magnetic recording tape should be of a lower resistance than the path through the magnetic tape, to prevent the aforesaid possibility of arcing resulting in the creation of "hot spots". The critical overlap area between the edge portions of the tape and the conductors must continuously maintain a firm contact as the tape is wrapped, curled or twisted. My heating tape design creates creating high pressure between the edge portions of the recording tape and the electrical voltage supply conductors during the lifetime of the tape, which produces the desired results without the need for electrically conductive adhesives.

During my investigations, I also discovered that by maintaining a relatively low pressure between the edge portions of the magnetic tape and the conductors, a pressure sensitive resistance element could be produced so that increased pressure upon the surface of the element would result in a substantial lowering of the resistance thereof. This second species of my invention is extremely useful in performing other tasks such as measuring pressure, particularly in environments such as robotics, where there may be little room for a pressure measuring device. Accordingly, a novel resistance element is provided which produces an electrical signal proportional to the pressure asserted thereon, or area of force applied which may also be readily utilized in an intrusion alarm system which easily discriminates between the weight/pressure of a child or pet and the weight/pressure of an intruder entering a protected premise, and may be readily positioned under large or small rugs, and the like. A further important object of my invention is to provide a portable weighing scale which need not utilize a rigid relatively bulky platform, and may be carried about on the person.

I also discovered during my investigations that the pressure insensitive species of my invention may be utilized in accordance with a novel method to inexpensively and easily manufacture thin flat precision resistors which do not have the loose tolerances of ordinary bulkier carbon resistors. Additionally, the precision resistors may be readily produced by the ultimate user on a customized basis. A second novel method enables the "on-the-spot" creation of entire customized networks of precision resistors by selectively removing portions of the pressure sensitive resistance element. Novel methods of mass producing the pressure sensitive and pressure insensitive tapes are also described.

SPECIFIC DESCRIPTION OF PREFERRED EMBODIMENTS

Other objects, features and advantages of the present invention will be become apparent upon study of the following description taken in conjunction with the drawings in which:

FIG. 1 illustrates a method of fabricating an elongated resistance in accordance with the present invention;

FIG. 2 an end view of a first species of the element;

Figure 10:
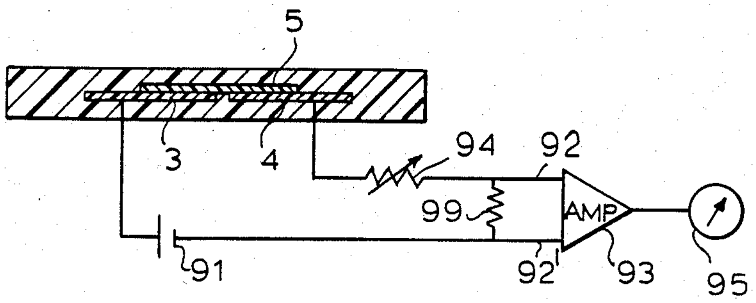
Figure 11:
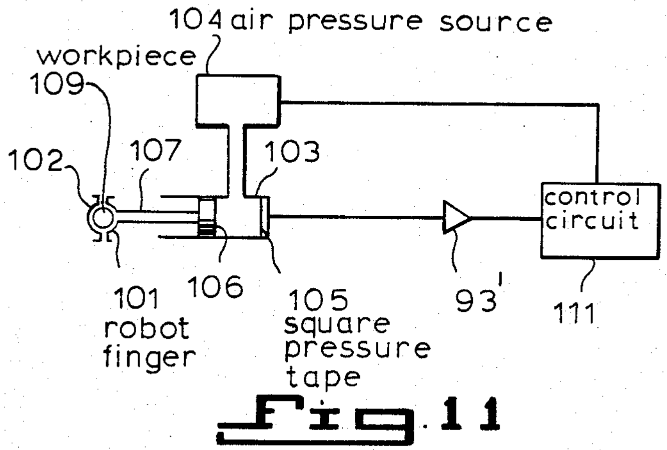

FIG. 5 a method of making precision customized resistors;

FIGS. 6–8 illustrate methods of fabricating resistive networks in accordance with the invention;

FIG. 9 an end view of a second species of the element, with a pair of laminating rolls adapted to laminate such element;

FIG. 10 illustrates the pressure sensitive element utilized as a p measuring device;

FIG. 11 illustrates an application of the pressure sensitive resistance element in robotics apparatus;

FIG. 12 illustrates the pressure sensitive element utilized in an intrusion alarm circuit;

FIG. 13 an aspect of the alarm circuit of FIG. 12;

FIG. 14 the pressure sensitive resistance elements utilized as a portable weighing scale; and FIGS. 15 and 16 a another embodiment of the novel pressure sensitive tape.

Figure 2:
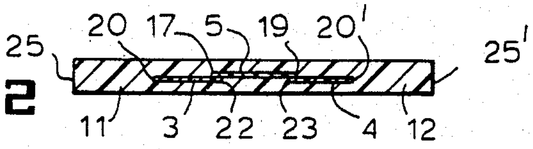
Figure 3:
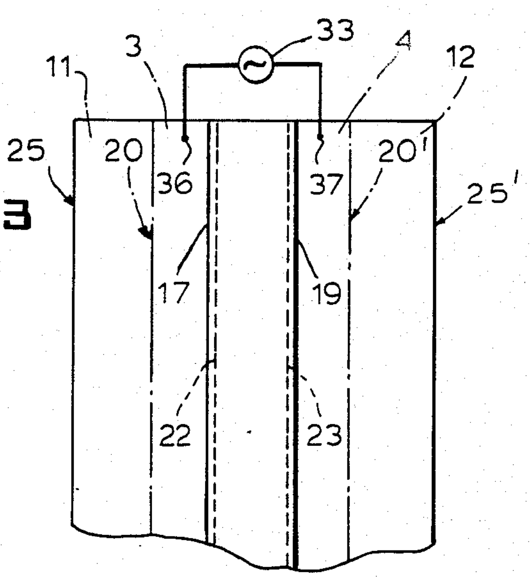
FIG. 3 illustrates a plan view of the element.

Referring now to FIG. 1, first and second pre-heated elongated plastic sheets 1 and 2 bearing heat activatable adhesives thereon are introduced into bite 6 of rollers 7 and 8 along with flat parallel ribbon conductors 3 and 4, and an elongated strip of ordinary commercially available magnetic recording tape 5, so that a laminated sandwich of the aforesaid components is produced as illustrated in FIGS. 2 and 3. Sheets 1 and 2 could be made of "Mylar" polyester coated with an ordinary heat activatable adhesive such as polyethylene, to cause sheets 1 and 2 to be laminated to each other in margin areas 11 and 12 illustrated in FIGS. 1, 2 and 3. These laminating methods are well known and are widely utilized to make data cards, drivers licenses, and badges.

In FIG. 2, illustrating a first pressure insensitive species of the invention, relatively narrow outer edge portions 17 and 19 of the recording tapes, overlap the inner edge portions 22 and 23 of the ribbon conductors 3 and 4. In the most preferred embodiment of the pressure insensitive species, the overlap area has a width of about 1/16 of an inch. It may be seen that the inner edge portions of the ribbon conductors are separated by a conductor gap, having a given gap width, and outer edge portions 20 and 20' of the conductors, are positioned away from the outer edges 25 and 25' of the elongated plastic sheets, to form margin portions enabling the first and second plastic sheets to be tightly laminated to each other. As a result of the lamination process, edge portions of the magnetic recording tape are continuously pressed firmly against the inner edge portions of the ribbon conductors within the overlap area throughout the lifetime of the heating tape, regardless of the orientation of the tape during its use. An ordinary radiant heater raises the heat activatable adhesive to a temperature in the range of about 250° to 275° F. to enable the laminating rollers 7 and 8 of FIG. 1 to produce a good lamination. In the case of fabricating the pressure insensitive resistance element utilized as a heating tape and to make resistors, the laminating pressure is preferably at least 7 pounds per linear inch along the length of bite 6 between rollers 7 and 8, and the combined thickness of the plastic strips, conductors and the magnetic recording tape is preferably less than 10 thousandths of an inch.

As previously discussed, the resistance element should have a uniform resistance and a low resistance should be consistently maintained at the contact between the magnetic tape resistor portion of the element, and the voltage supply strip conductors. Ordinary widely available, inexpensive magnetic recording tape having a thickness of typically 0.5 to 1.5 thousandths of an inch, and less than two thousandths of an inch, comprises a plastic substrate having a suspension of ferrite or magnetic oxide particles therein. While any commercially marketed magnetic recording tape will produce good results, studio tape is preferred. For a more detailed description of these tapes see Van Nostrand's Scientific Encyclopedia; Sixth Edition, Vol. 2; page 1804. For the various magnetic tape sizes commercially available, I have determined that the conductor gap for the pressure insensitive element of my invention should be relatively large since a fairly high resistance value is generally desired in the use of my novel resistance element for heating tape and precision resistors. For example, the conductor gap between the inside edges of the conductive ribbons at 22 and 23 would be typically ⅛ of an inch for a recording tape having a width of 3/16. Wider tapes call for wider conductive gaps and I have determined that the preferred tape width to conductor gap ratio should be between 1.06 and 1.6. The lamination of plastic sheets under heat and pressure described above enables good electrical contact to be maintained, even though heat and pressure will not cause the tape to actually stick to the metallic ribbons 3 and 4; yet surprisingly, no bonding adhesive is required. Commercially available recording tapes of 0.5 mils in thickness are preferred and the aforesaid high resistance contact points have been eliminated. For heating tapes and precision resistors, the resulting high internal pressure upon the tape made as explained above, is such that further increases in pressure asserted against the tape during its use will not create any significant change in the resistance of the tape.

Figure 4:
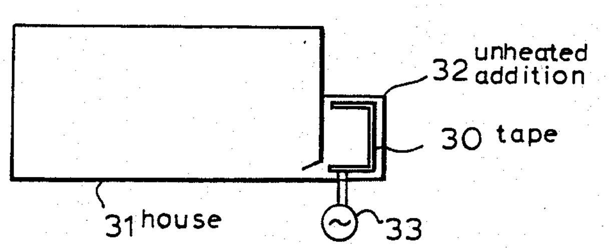
FIG. 4 illustrates installation of the heating tape.

FIG. 4 illustrates a main portion of a heated house 31 having an unheated addition 32. The pressure insensitive species of the invention can be cut to any desired length and placed where needed. For example, strips of heating tape 30 of FIGS. 1, 2 and 3, may be installed anywhere along the walls or upon the floor of the unheated portion 32 of the house, and are cut to the appropriate lengths. Ribbon or strip conductors 3 and 4, are electrically connected to a voltage source 33 such as 110 volts AC as shown in FIGS. 3 and 4. To energize the heating tape, a snap-on connector can be placed at any location on the heating tape, and as the connector is snapped on, first and second pointed contacts penetrate the plastic surface to "bite" into the first and second strip conductors 3 and 4 respectively, at portions 36 and 37 of FIG. 3. Also, after cutting the appropriate length of heating tape, the ends may be sealed by means of a hot melt glue gun. The tape may be utilized to heat other interiors such as a motor vehicle, and a twelve volt battery could be utilized for this purpose.

PRECISION RESISTORS

A second important application of the pressure insensitive resistive element first species of the invention, is illustrated in FIG. 5. Ordinary carbon resistors, have loose tolerances, and it is highly desirable to provide an inexpensive method of enabling a user or manufacturer, to easily and rapidly produce precision resistors of a desired value. In accordance with my novel method, pressure insensitive tape described above, is cut to a length which is inversely proportional to the desired resistance. For example, should a user desire to produce a 200K ohm resistor, he or she cuts across the tape with a scissor or pivoted paper "chop" knife, ½ inch from the right hand end 42, at 43, and the connection is completed by means of driving pins 35 and 35' through conductor ribbons 3 and 4, and wire wrapping the pins. The wire wrap technique is well known, and employs a widely available powered wrapping tool resembling a thick pencil; no soldering is required. Should the cut be made at 46, one inch from the right hand edge 42, the result will be a precision resistor of 100K ohms. In like manner a cut made at 47, ten inches from the right hand edge 42, will produce a 10K ohm resistor, and so forth. This result is apparent from examining the well known parallel resistance formula: RX=R1R2/R1+R2. For example, a ten inch cut has, in effect ten times the number of resistive units in parallel relative to a one inch cut. If desired, various visual indicia may be provided at these positions to aid the user; V notches 48 are exemplary aids in producing a precise cut to in turn produce a precise resistance value. The above stated actual values were produced by the inventor by cutting ¼ inch wide "Scotch" brand iron oxide recording tape having a thickness of one mil, sold by 3M Corporation.

FIG. 7 illustrates a prior art arrangement of a two resistance electrical circuit. In FIG. 6, the often imprecise carbon resistors of FIG. 7 are replaced by tape segments of the pressure insensitive species of the invention, and a hole 51 is punched through the lower ribbon conductor 4 across its entire width as indicated, to thereby electrically isolate the lower portions of the resistors from each other. On the other hand, the upper resistor portions are electrically connected together by the upper ribbon conductor 3, which remains unpunched. The tape portion to the right of the punched hole 51 has a length of one inch (from points 50' to 55') and the portion to the left of the hole (from 50' to 65') has a length of one half inch, and thus the right hand resistor has half the value (100K) of the left hand one (200K). The resulting resistors made by the previously described laminating process, are typically less than about 10 mils in thickness, and thus may be utilized where space is limited, since they may be slipped between components. Also, heat dissipation is substantial, since a relatively large area is inherently present in the design of these resistors. This procedure is of course not limited to an individual user, and may be utilized in the mass production of electronic circuits.

Figure 8B:
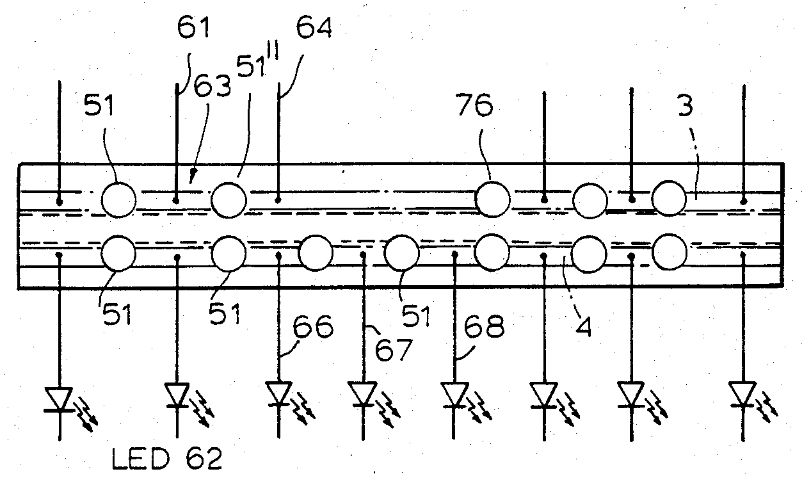
Figure 8A:
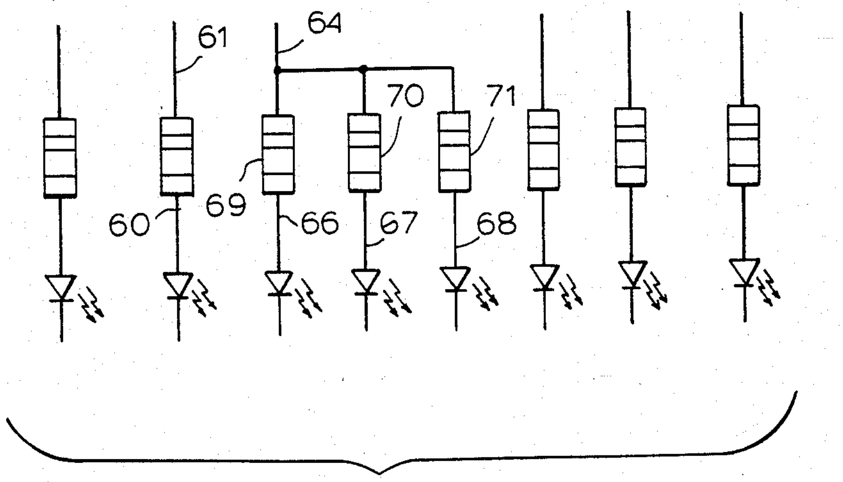
Fig. 8A PRIOR ART

In FIG. **8*a*, a typical prior art multiple resistor circuit for energizing a linear array of LEDS is illustrated, together with FIG. 8*b*, illustrating the equivalent circuit employing the pressure insensitive species of the resistance element of the invention. The aforesaid punched holes 51 are again illustrated for electrically isolating portions of the tape resistance elements. For example, lead 61 is coupled to LED 62 through tape section 63 which is electrically isolated from the other tape sections by means of the punched holes 51. In contrast however, lead 64 is to be coupled to leads 66, 67 and 68 via three resistors, 69, 70 and 71, illustrated in FIG. 8*a*. The result is easily achieved merely by omitting the punched holes from the upper ribbon conductor 3 positioned between punched hole 51'' and punched hole 76. Assuming one wishes to electrically couple lead 64 to all of the LEDS, this is easily effected merely by omitting punching out any portions of the upper ribbon conductor 3. Omission on a selected basis, of the punched holes within the lower ribbon portion 4** will result in the precision control of the values of the resistors as explained earlier. Thus it should be appreciated that the method of the invention employing the pressure insensitive tape species, along with the selective punching out of portions of the ribbon conductors, results in an extremely flexible method of customizing electrical circuits.

PRESSURE SENSITIVE EMBODIMENTS

FIG. 9 schematically illustrates a laminated product which is laminated by heat and pressure along margin portions 12 and 11 as previously described. However, flat ribbon conductors 3 and 4 are separated by a relatively narrow conductive gap shown at 81. Unlike the pressure insensitive resistance element described above, the pressure between the magnetic recording tape and the inner portions of the ribbon conductors within the aforesaid overlap area, is maintained sufficiently low to enable substantial changes in the resistance of the resistance element to be produced upon the application of pressure to the element during the lifetime thereof. This result is preferably produced in production by forming an annular recess or trench 83 within roller 7, so that pressure is maintained relatively low at the overlap area between the magnetic tape 5 and the strip conductors 3 and 4. A good laminating bond is however still produced in the aforesaid margin portions 11 and 12. This effect enables the recording tape to be squeezed by additional externally applied pressure, to cause its resistance to be significantly reduced during the lifetime of the tape. Additionally, changes in the recording tape resistance are enhanced by producing a larger overlap area between the recording tape and the inner edge portions of the ribbon conductors 3 and 4. This can be seen by comparing FIG. 9 with FIG. 2. In other words, externally applied pressure, causes compression within the recording tape to be distributed over a far greater portion of the tape, to enhance the resistance changes as a function of pressure changes being measured and applied to the resistance element after manufacture. I have determined that the proper ratios of the width of the recording tape 5 over the width of gap 81 are at least 1.5. For such a tape having a width of 3/16 of an inch, a desire to employ a gap of 1/32, yielding a ratio of six. For a one inch wide tape, I would desire a minimum gap of 1/16 inches, yielding a ratio of 16.

A pressure sensitive resistance element is schematically illustrated in FIG. 10, whereby a current is induced in the element by a voltage source such as battery 91, coupled in series with strip conductors 3 and 4, resistor 99, and input terminals 92 and 92' of amplifier 93 via a variable resistor 94, which may be utilized for calibration purposes. Changes in the resistance of the element are detected by this arrangement, and an analog indication of the current passing through the element at any time is produced by meter 95.

It is extremely important in the field of robotics to maintain a constant controlled pressure between robot "fingers", schematically represented by members 101 and 102 of FIG. 11. Cylinder 103 is coupled to a pneumatic pressure source 104 for asserting pressure against piston 106 coupled to robot finger 101 via link 107. In this arrangement, changes in the pneumatic pressure within pressure cylinder 103, will produce changes in the force exerted by finger element 101 against a work piece, schematically indicated at 109. The desired pressure may be maintained constant by employing a feedback servo control circuit 111 for controlling pneumatic pressure source 104, as is known in the art. Cylinder 103 may be quite small, so that it is highly desirable to provide a pressure sensor which is also small and thin, to enable it to be fit within cylinder 103. A square or rectangular portion 105 of the pressure sensitive tape element of the invention, is positioned at the right hand portion of the pressure cylinder and is coupled to amplifier 93' to function in the manner described above in connection with FIG. 10. Thus, FIG. 11 illustrates an important beneficial use of the pressure sensitive embodiment of the tape resistance element of the invention.

INTRUSION ALARMS

A number of pressure sensitive elongated resistance elements of the invention described in connection with FIG. 9 may be positioned under rug 132 of FIG. 12 in parallel strips, and the ribbon conductors 3 and 4 of the strips, are coupled in parallel via leads 135 to an adjustable threshold device 134, which in turn is coupled to any conventional alarm indicator 136 shown in FIG. 12. Current changes due to the weight of an intruder upon the elements actuates the alarm. Since the elongated pressure sensitive tape of the invention is very cheap to manufacture, large numbers of parallel strips of such tape may be positioned under rugs to cover very wide areas. For exemplary threshold devices utilizing Triacs or Schmidt triggers see pages 421, 592, 593 of "Encyclopedia of Electronic Circuits", Tab Books, 1985. FIG. 13 illustrates voltages applied to adjustable threshold device 134 as a function of pressure. Circuit 134 is adjusted so that the weight of an adult would produce an input voltage level applied to unit 134 by the voltage drop across resistor 99' in series with source 91', exceeding level 137, which in turn would actuate alarm device 136. On the other hand, the weight of a pet or child would produce insufficient voltage levels to trip the alarm, since the resistance changes induced in recording tape 5 within the pressure sensitive tapes would be too small.

PORTABLE WEIGHING SCALE

In FIG. 14, a flexible mat 111 is illustrated, containing the pressure sensitive tapes 100 positioned alongside of each other within the mat. As in FIG. 12, the ribbon conductors 3 and 4 of the tapes within the mat are coupled in parallel, and are connected to an LED weight indicator (digital voltmeter) circuit 113 via amplifier 114. The circuit would be battery operated, so that the 9"×12" mat 111 could be rolled up and carried in a large pocketbook for example, of a user. The mat is unrolled and the user stands upon the mat at positions indicated at 116 and 117 to register the user's weight. Weight increases reduce tape resistances to increase the voltage drop across resistor 112, in series with battery 91'; while resistor 100 is adjusted to calibrate the scale to a zero setting. Weight decreases, increase tape resistances to produce the opposite effect. Thus the FIG. 14 arrangement provides an inexpensive portable weighing scale, which need not utilize a conventional weighing platform.

ON/OFF PRESSURE SENSITIVE TAPE SWITCH

Referring now to FIG. 15, a pressure sensitive tape switch is illustrated, having substrate 120 bearing strip or ribbon conductors 3 and 4, and elongated resilient strips 121 and 122 as illustrated. These resilient strips are preferably about 5 thousandths of an inch thick, and are made of polyester. Recording tape 5 is mounted upon the underside of corregated cover strip 123, which in turn is affixed to substrate 120 via side portions 126 and 127. The resilient support strips maintain the strip of magnetic recording tape 5 over the ribbon conductors 3 and 4 but out of contact with them, so that normally, an open circuit is present between the conductors. Upon the application of pressure to the upper corregated cover strip 123, the recording tape 5 will electrically bridge conductors 3 and 4, and will have a resistance which varies inversely as a function of the pressure applied to cover strip 123. The tape switch may be stored and shipped in a roll 125 as indicated in FIG. 16, the corrugations 123 aiding in the ability of the tape to be tightly rolled up. This is an important consideration with regard to economically storing the tape, which may be cut to any desired length, and utilized as previously described in connection with the alarm system of FIG. 12. Unlike the pressure sensitive tape described previously, current will not flow through the recording tape 5 although it is coupled in series with a voltage source as in FIG. 12, until some pressure is exerted upon strip 123. This has the advantage of saving battery power, and reduces malfunctions resulting in undesired actuation of the alarm devices.

The description presented is merely exemplary, and numerous variations may be made in practicing the invention and thus the scope of the invention is to be limited only by the terms of the claims and equivalents thereof.

What is claimed is:

1. A method of making an electrical resistance element comprising the steps of:

(a) providing first and second substantially electrically non-conductive elongated sheets having outer edges bounding the width of said sheets, and capable of being laminated together;

(b) positioning first and second thin flat electrical conductors in a spaced apart relationship from each other and in between said sheets, the first and second conductors having inner edge portions which are separated to define a conductor gap having a given conductor gap width, and having outer edge portions positioned away from the outer edges of said elongated sheets to form margin portions enabling said first and second sheets to be tightly laminated to each other within said margin portions;

(c) positioning portions of magnetic recording tape over said first and second electrical conductors in overlapping relationship with the inner edge portions of said conductors within an overlap area having a given width; and (d) laminating said electrical conductors, said magnetic recording tape and said first and second sheets together for causing said portions of said magnetic recording tape to be pressed firmly against said inner edge portions of said conductors within said overlap area.

2. The method of claim 1 wherein step (d) includes producing laminating pressure between said magnetic recording tape and said electrical conductors within said overlap area great enough to prevent any substantial change in the resistance of said element upon the application of pressure thereto.

3. The method of claim 1 wherein the ratio of the width of said tape over the width of said gap is between 1.06 and 1.6.

4. The method of claim 2 wherein the ratio of the width of said tape over the width of said gap is between 1.06 and 1.6.

5. The method of claim 1 wherein step (d) includes maintaining laminating pressure between said magnetic recording tape and said electrical conductors within said overlap area sufficiently low to cause substantial changes in the resistance of said resistance element upon the application of pressure thereto.

6. The method of claim 1 wherein the ratio of the width of said tape over the width of said gap is greater than 1.5.

7. The method of claim 5 wherein the ratio of the width of said tape over the width of said gap is greater than 1.5.

8. The method of claim 1 wherein the width of said overlap area between the portions of said tape and the inner edge portions of said electrical conductors is about one sixteenth of an inch.

9. The method of claim 2 wherein the width of the overlap area between the edge portions of said tape and the inner edge portions of said electrical conductors is about one sixteenth of an inch.

10. The method of claim 1 wherein said magnetic recording tape has a thickness of less than two thousandths of an inch, and includes ferrite or magnetic oxide particles therein.

11. The method of claim 1 wherein said magnetic recording tape is studio tape including chromium oxide.

12. The method of claim 1 wherein the combined thickness of said first and second plastic strips, said conductors, and said magnetic recording tape is less than ten thousands of an inch, and step (d) is carried out by a roll laminator utilizing a pair of laminating rolls having a bite pressure of at least seven pounds per linear inch, applied across the width of said sheets, and step (d) includes heating said sheets to a temperature enabling lamination of said sheets together by heat and pressure.

13. The method of claim 1 wherein the combined thickness of said first and second plastic strips, said conductors, and said magnetic recording tape is less than ten thousands of an inch, and step (d) is carried out by a roll laminator utilizing a pair of laminating rolls for applying laminating pressure to said sheets primarily over said margin portions and little or no pressure over the non-margin portions, and step (d) includes heating said sheets to a temperature enabling lamination of said sheets together by heat and pressure.

14. A method of making a resistor having a selectable resistance value comprising the steps of:

(a) providing at least one elongated electrical resistance element comprising first and second electrical conductors separated from one another, a strip of magnetic recording tape having a given width and a first tape portion firmly and permanently affixed to said first conductor in electrical contact therewith, and a second tape portion firmly and permanently affixed to said second conductor in electrical contact therewith, and wherein said conductors are elongated strips having inner and outer edge portions, said inner edge portions separated by a conductor gap and wherein said tape is wider than said gap, electrically bridges said gap, and wherein the contact pressure between said magnetic recording tape and said electrical conductors is great enough to prevent any substantial change in the resistance of said element upon the application of pressure thereto; and (b) cutting across said elongated resistance element to produce a segment having a length inversely proportional to a desired resistance.

15. The method set forth in claim 14 wherein visual indicia are provided at spaced intervals along the length of said elongated resistance element, to facilitate cutting across said tap at precise positions to produce resistors of a precise desired value.

16. The method of claim 14 wherein said magnetic tape has a thickness of less than two thousandths of an inch, and includes ferrite or magnetic oxide particles therein.

17. The method of claim 14 wherein said magnetic recording tape is studio tape including chromium oxide.

18. A method as defined by claim 14, wherein the ratio of the width of said tape over the width of said gap is between about 1.06 and about 1.6.

19. A method of making a plurality of resistors, which comprises the steps of:

(a) providing at least one elongated electrical resistance element comprising first and second electrical conductors separated from one another, a strip of magnetic recording tape having a given width and a first tape portion firmly and permanently affixed to said first conductor in electrical contact therewith, and a second tape portion firmly and permanently affixed to said second conductor in electrical contact therewith, and wherein said conductors are elongated strips having inner and outer edge portions, said inner edge portions separated by a conductor gap and wherein said tape is wider than said gap, electrically bridges said gap, and wherein the contact pressure between said magnetic recording tape and said electrical conductors is great enough to prevent any substantial change in the resistance of said element upon the application of pressure thereto; and (b) selectively removing entire sub-portions of at least one of said electrical conductors to produce a plurality of resistors.

20. The method of claim 19 wherein step (b) of claim 19 includes removing said entire sub-portions of said conductors at variable positions along said conductors to produce resistors having varying values.

21. A method as defined by claim 19 wherein said magnetic tape has a thickness of less than two thousandths of an inch, and includes ferrite or magnetic oxide particles therein.

22. A method as defined by claim 19 wherein said magnetic recording tape is studio tape including chromium oxide.

23. A method as defined by claim 17, wherein the ratio of the width of said tape over the width of said gap is between about 1.06 and about 1.6.

24. A method of making an electrical resistance element comprising the steps of:

(a) positioning first and second thin flat electrical conductors in a spaced apart relationship from each other, the first and second conductors having inner edge portions which are separated to define a conductor gap having a given conductor gap width;

(b) positioning portions of a magnetic recording tape over said firsts and second electrical conductors in overlapping relationship with the inner edge portions of said conductors to define an overlap area having a given width so that the inner edge portions of said conductors are in electrical contact with said portions of the magnetic recording tape.

25. A method as defined by claim 24, wherein the ratio of the width of said tape over the width of said gap is between about 1.06 and about 1.6.

26. A method as defined by claim 24, wherein the ratio of the width of said tape over the width of said gap is greater than about 1.5.

27. A method as defined by claim 24, wherein the width of the overlap area defined by the overlap of said portions of the tape and the inner edge portions of the conductors is about one sixteenth of an inch.

28. A pressure sensitive tape-switch comprising:

(a) a substrate having first and second electrical conductors positioned thereon;

(b) a strip of magnetic recording tape situated to overlie portions of the first and second conductors; and (c) insulating means interposed between the strip of magnetic recording tape and the first and second conductors for insulating the strip of magnetic recording tape from said conductors and for selectively maintaining the tape out of contact therewith, so that only pressure exerted upon said tape-switch will cause said tape to electrically bridge said conductors.

29. The tape-switch of claim 28 which further comprises an elongated corrugated cover mounted over said strip of magnetic recording tape.

30. The tape-switch of claim 28 wherein said insulating means are affixed to said substrate, and comprises at least two elongated strips of springy material.

31. The tape-switch of claim 30 wherein said electrical conductors are thin flat ribbons positioned parallel to said strips of springy material.

32. The tape-switch of claim 31 wherein said magnetic recording tape has a thickness of less than two thousandths of an inch, and includes ferrite or magnetic oxide particles therein.

33. The tape-switch of claim 31 wherein said magnetic recording tape is studio tape including chromium oxide.

34. The tape-switch of claim 30 which further comprises an elongated corrugated cover mounted over said strip of magnetic recording tape.

35. The tape-switch of claim 31 which further comprises an elongated corrugated cover mounted over said strip of magnetic recording tape.

36. The tape-switch of claim 32 which further comprises an elongated corrugated cover mounted over said strip of magnetic recording tape.

37. The tape-switch of claim 33 which further comprises an elongated corrugated cover mounted over said strip of magnetic recording tape.

* * * * *